(12) United States Patent
Kisaki et al.

(10) Patent No.: US 10,832,980 B2
(45) Date of Patent: *Nov. 10, 2020

(54) ELECTRONIC COMPONENT HOUSING PACKAGE, MULTI-PIECE WIRING SUBSTRATE, ELECTRONIC APPARATUS, AND ELECTRONIC MODULE

(71) Applicant: KYOCERA Corporation, Kyoto (JP)

(72) Inventors: Takuo Kisaki, Kyoto (JP); Masaki Suzuki, Kyoto (JP)

(73) Assignee: KYOCERA CORPORATION, Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/509,163

(22) Filed: Jul. 11, 2019

(65) Prior Publication Data

US 2019/0333831 A1    Oct. 31, 2019

Related U.S. Application Data

(63) Continuation of application No. 15/570,992, filed as application No. PCT/JP2017/001706 on Jan. 19, 2017, now Pat. No. 10,381,281.

(30) Foreign Application Priority Data

Jan. 22, 2016   (JP) .................................. 2016-010760

(51) Int. Cl.
*H01L 23/04*        (2006.01)
*H01L 23/12*        (2006.01)
(Continued)

(52) U.S. Cl.
CPC .............. *H01L 23/04* (2013.01); *H01L 23/12* (2013.01); *H01L 23/13* (2013.01); *H05K 1/113* (2013.01);
(Continued)

(58) Field of Classification Search
CPC ......... H01L 23/04; H01L 23/13; H01L 23/12; H01L 2924/15153; H05K 3/0097;
(Continued)

(56) References Cited

U.S. PATENT DOCUMENTS 8,008,980 B2    8/2011  Moriya
8,952,269 B2    2/2015  Hasegawa
(Continued)

FOREIGN PATENT DOCUMENTS

CN          102184908 A       9/2011
CN          102522383 A       6/2012
(Continued)

OTHER PUBLICATIONS

International Search Report and Written Opinion, PCT/JP2017/001706, dated Apr. 11, 2017, and English Translation (11 pages) *cited in parent application (*cited in parent application).

*Primary Examiner* — Alexander O Williams
(74) *Attorney, Agent, or Firm* — Volpe Koenig

(57) ABSTRACT

An electronic component housing package includes an insulating substrate having a first principal face and a second principal face opposing the first principal face; external connection conductors provided on the second principal face; and connection conductors provided so as to extend from outer peripheral ends of the external connection conductors to outer peripheral ends of the insulating substrate, respectively. The connection conductors are provided so as to be curved convexly toward a first principal face side over a range from the outer peripheral ends of the external connection conductors to the outer peripheral ends of the insulating substrate in a vertical cross-sectional view of the electronic component housing package and so that a distance from each of the connection conductors to the second principal face is gradually increased in a thickness direction
(Continued)

of the insulating substrate. Insulating bodies are provided so as to cover the connection conductors, respectively.

12 Claims, 4 Drawing Sheets

(51) Int. Cl.
*H01L 23/13* (2006.01)
*H05K 1/11* (2006.01)
*H05K 1/18* (2006.01)
*H05K 3/00* (2006.01)
*H05K 3/46* (2006.01)

(52) U.S. Cl.
CPC ............ *H05K 1/181* (2013.01); *H05K 1/183* (2013.01); *H05K 3/0052* (2013.01); *H05K 3/0097* (2013.01); *H05K 3/4697* (2013.01)

(58) Field of Classification Search
CPC ...... H05K 3/0052; H05K 1/183; H05K 1/113; H05K 1/181; H05K 2/4697; H05K 3/4697; H05K 1/11; H05K 1/18; H05K 3/00
USPC .......................................................... 257/701
See application file for complete search history.

(56) References Cited

U.S. PATENT DOCUMENTS

| | | |
|---|---|---|
| 2002/0074634 A1 | 6/2002 | Choi |
| 2003/0006492 A1 | 1/2003 | Ogasawara |
| 2004/0022043 A1 | 2/2004 | Sakai et al. |
| 2004/0232507 A1 | 11/2004 | Furukubo et al. |
| 2007/0096305 A1 | 5/2007 | Fuergut |
| 2013/0003375 A1 | 1/2013 | Hussell |
| 2014/0174803 A1 | 6/2014 | Suzuki |
| 2015/0208512 A1 | 7/2015 | Akita |
| 2018/0040773 A1 | 2/2018 | Fukuda |
| 2018/0324969 A1 | 11/2018 | Onitsuka |
| 2018/0358949 A1 | 12/2018 | Kisaki |
| 2019/0043770 A1* | 2/2019 | Kisaki .................... H05K 1/183 |

FOREIGN PATENT DOCUMENTS

| | | |
|---|---|---|
| CN | 102543931 A | 7/2012 |
| CN | 202394891 U | 8/2012 |
| CN | 205692865 U | 11/2016 |
| CN | 207977946 U | 10/2018 |
| JP | 2000-216507 A | 8/2000 |
| JP | 2004-104091 A | 4/2004 |
| JP | 2005-050935 A | 2/2005 |
| JP | 2006-041286 A | 2/2006 |
| JP | 2007-311436 A | 11/2007 |
| JP | 2008-053957 A | 3/2008 |
| JP | 2010-074118 A | 4/2010 |
| JP | 2013-165149 A | 8/2013 |

* cited by examiner

ELECTRONIC COMPONENT HOUSING PACKAGE, MULTI-PIECE WIRING SUBSTRATE, ELECTRONIC APPARATUS, AND ELECTRONIC MODULE

CROSS-REFERENCE TO RELATED APPLICATIONS

This application is a continuation of U.S. application Ser. No. 15/570,992, filed Oct. 31, 2017 which claims the benefit of PCT/JP2017/001706, filed Jan. 19, 2017 which claims the benefit of JP2016-010760, filed on Jan. 22, 2016, the contents of which are incorporated herein by reference.

TECHNICAL FIELD

The invention relates to an electronic component housing package for hermetically receiving therein an electronic component such as a piezoelectric oscillation device, and the like.

BACKGROUND ART

Conventionally, as an electronic component housing package in which an electronic component such as a piezoelectric oscillation device or a semiconductor device is mounted, an electronic component housing package provided with a mounting section for mounting an electronic component on an insulating substrate made of a ceramic sintered body or the like has generally been used. A lid body is joined to an upper surface of the insulating substrate so as to cover the mounting section. Such an electronic component housing package includes the insulating substrate having a plate-shaped base and a frame-shaped frame; and wiring conductors formed to extend from the mounting section to a lower surface of the base and the like, the base having the mounting section for the electronic component on an upper surface thereof, and the frame being laminated on the upper surface of this base so as to surround the mounting section.

Of the wiring conductors, the wiring conductor provided in the mounting section functions as a connection pad to which the electronic component is connected, and the wiring conductor provided on the lower surface of the base (a lower surface of the insulating substrate) functions as a conductor for external connection (an external connection conductor) when being mounted on a module substrate. Then, after the electronic component is mounted in the mounting section and each electrode of the electronic component is electrically connected to the connection pad, the mounting section is sealed by the lid body and the like, and an electronic apparatus is thereby produced. In addition, a frame-shaped metallized layer is formed on an upper surface of the frame, so as to join the lid body made of metal thereto. In this electronic component housing package, the lid body is joined to the frame-shaped metallized layer by a sealing material such as silver solder, and the electronic component is thereby hermetically sealed in the mounting section.

Here, in order to prevent oxidation corrosion and facilitate the connection with the electronic component, the connection with the module substrate by solder or the like, and the like, a nickel plating layer and a gold plating layer are sequentially deposited on each of the wiring conductors of the electronic component housing package such as the connection pad which is exposed therefrom. In order to deposit the plating layers on each of the wiring substrates, the following technique is adopted. For example, such a structure is prepared that a through hole is provided in an outer periphery of each wiring substrate region formed and arranged in a matrix substrate and becoming the electronic component housing package, that an inner surface conductor is provided on an inner surface of this through hole, that a through conductor is provided near the outer periphery of each of the wiring substrate regions, that a connection conductor extending across the adjacent wiring substrate regions so as to connect the through conductors is provided, and that the wiring substrate regions are integrally connected via the inner conductors, the connection conductors, and the like. Then, the plating layers are deposited on the wiring conductors of each of the wiring substrate regions that are exposed therefrom by an electroplating method in which electricity is supplied to all of the wiring conductors formed in the matrix substrate. Note that, since a division groove is formed between two each of the wiring substrate regions on both surfaces of the matrix substrate so as to oppose each other, the connection conductors are provided in an inner layer of the insulting substrate so as to prevent cutting thereof by formation of the division grooves (see Japanese Unexamined Patent Publication JP-A 2005-50935).

SUMMARY OF INVENTION

Technical Problem

Meanwhile, in recent years, the electronic component housing package has been reduced in size and height. Due to this, the matrix substrate, in which the wiring substrates becoming the electronic component housing packages are arranged, is extremely thinned. Accordingly, the electronic component housing package with such a simple structure that the through hole is not provided in the outer periphery of each of the wiring substrate regions and that the connection conductors are only provided on one surface of each of the wiring substrate regions is produced.

In the case where the matrix substrate is configured so that the connection conductor for integrally connecting the wiring conductors is only provided on the one surface of each of the wiring substrate regions, the connection conductor is cut by the formation of the division groove. Accordingly, in the case where the division grooves are provided in one principal face of the matrix substrate, the connection conductors are provided on the other principal face, which leads to such a problem that the division grooves cannot be formed therein. Then, in the case where such a matrix substrate, which is provided with the division grooves only in the one surface, is divided, an end of the connection conductor is delaminated due to stress generated during a division process. As a result, due to reduction of bonding strength between the connection conductor and the insulating substrate and generation of a burr or a crack in the wiring substrate after the division process, there is a possibility that the electronic component housing package does not have predetermined external dimensions.

Solution to Problem

An electronic component housing package according to one aspect of the invention comprises an insulating substrate having a first principal face and a second principal face opposing the first principal face, the insulating substrate having a lower insulating layer including the second principal face, the lower insulating layer having a mounting section for mounting an electronic component, and a frame-shaped upper insulating layer including the first principal face, the frame-shaped upper insulating layer being provided on the lower insulating layer so as to surround the mounting section; a plurality of external connection conductors provided on the second principal face; and connection conductors provided so as to extend from outer peripheral ends of the external connection conductors to outer peripheral ends of the insulating substrate, respectively, the connection conductors being provided so as to be curved convexly toward a first principal face side over a range from the outer peripheral ends of the external connection conductors to the outer peripheral ends of the insulating substrate in a vertical cross-sectional view of the electronic component housing package and so that a distance from each of the connection conductors to the second principal face is gradually increased in a thickness direction of the insulating substrate, insulating bodies being provided so as to cover the connection conductors, respectively.

A multi-piece wiring substrate according to one aspect of the invention comprises a matrix substrate having a plurality of wiring substrate regions provided therein, each of which is to be the above electronic component housing package.

An electronic apparatus according to one aspect of the invention comprises the above electronic component housing package; and an electronic component mounted in the electronic component housing package.

An electronic module according to one aspect of the invention comprises the above electronic apparatus; and a module substrate to which the electronic apparatus is connected.

Advantageous Effects of Invention

In accordance with the electronic component housing package according to one aspect of the invention, it comprises the insulating substrate having the first principal face and the second principal face opposing the first principal face, the insulating substrate having the lower insulating layer including the second principal face, the lower insulating layer having the mounting section for mounting the electronic component, and the frame-shaped upper insulating layer including the first principal face, the frame-shaped upper insulating layer being provided on the lower insulating layer so as to surround the mounting section; the plurality of external connection conductors provided on the second principal face; and the connection conductors provided so as to extend from the outer peripheral ends of the external connection conductors to the outer peripheral ends of the insulating substrate, respectively, the connection conductors being provided so as to be curved convexly toward the first principal face side over a range from the outer peripheral ends of the external connection conductors to the outer peripheral ends of the insulating substrate in the vertical cross-sectional view and so that the distance from each of the connection conductors to the second principal face is gradually increased in the thickness direction of the insulating substrate, the insulating bodies being provided so as to cover the connection conductors, respectively. With such a structure, even when the electronic component housing package is downsized, such a structure is obtained that the connection conductors are covered with the insulating bodies in greater thickness as approaching an outer periphery of the wiring substrate. Accordingly, even when a division groove is provided on the second principal face side of the matrix substrate, for example, the connection conductor is less likely to be cut by the division groove. In addition, even in the case where stress generated during a division process is applied to an end of the connection conductor when the matrix substrate is divided, the connection conductor is less likely to be delaminated, and reduction of bonding strength between the connection conductor and the insulating substrate is inhibited. Therefore, the electronic component housing package can firmly be mounted on the module substrate.

In accordance with the multi-piece wiring substrate according to the one aspect of the invention, the plurality of wiring substrate regions, each of which is to be the above electronic component housing package, are provided in the matrix substrate. Therefore, generation of a burr or a crack is inhibited when the matrix substrate is divided into individual pieces of the wiring substrates, and the electronic component housing packages with superior dimensional accuracy can efficiently be produced.

In accordance with the electronic apparatus according to the one aspect of the invention, by using the above electronic component housing package, it is possible to realize the electronic apparatus with high connection reliability that inhibits reduction of bonding strength and mounting failure in a mounting process of the electronic component on the module substrate.

In accordance with the electronic module according to the one aspect of the invention, by using the above electronic apparatus, it is possible to realize the electronic module whose connection reliability with the electronic component mounted in the mounting section is increased and which has the superior operation reliability.

DESCRIPTION OF EMBODIMENTS

Figure 1A:
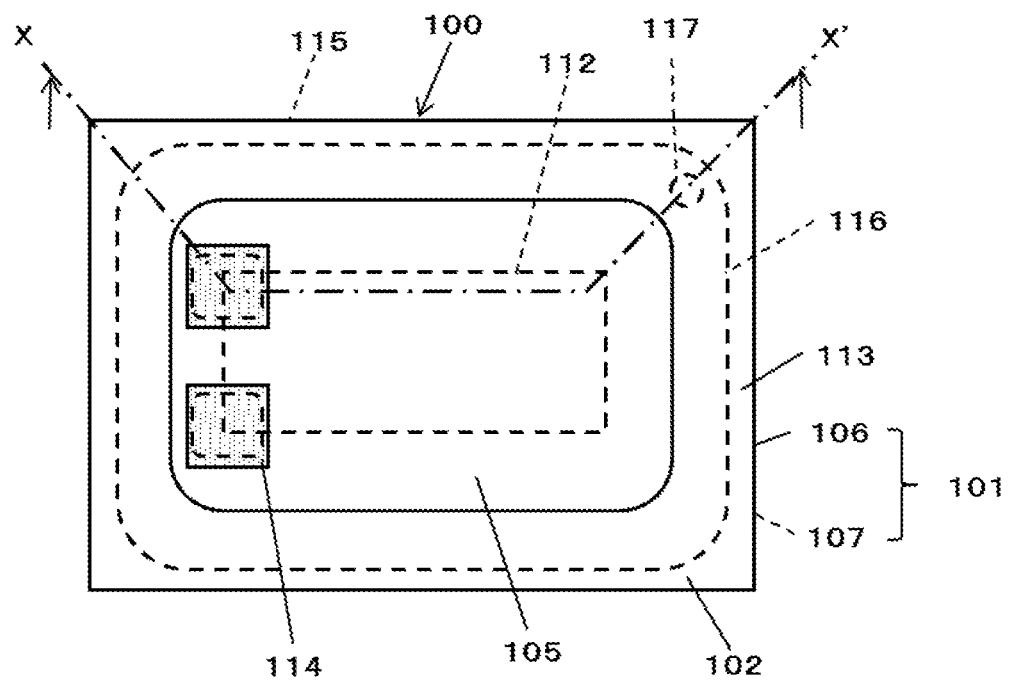
FIG. 1A is a transparent top view showing an electronic component housing package according to an embodiment of the invention.

A description will be made on an electronic component housing package according to an embodiment of the invention and the like with reference to the accompanying drawings. FIG. 1A is a transparent top view showing one example an electronic component housing package 100 according to of an embodiment of the invention, and FIG. 1B is a cross-sectional view taken along the line X-X' in FIG. 1A.

Figure 1B:
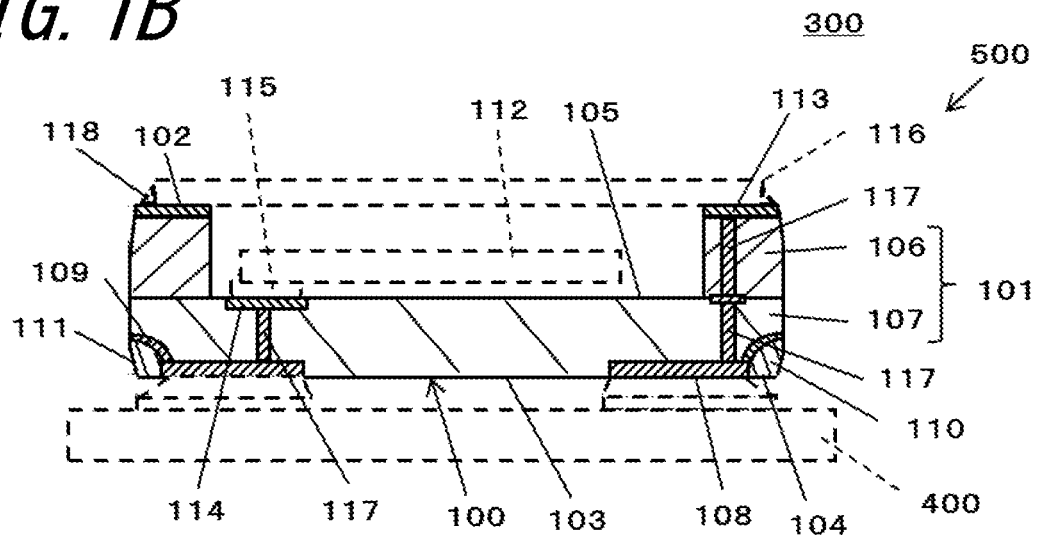
FIG. 1B is a cross-sectional view taken along the line X-X' in FIG. 1A.

In FIGS. 1A and 1B, the electronic component housing package 100 has: a first principal face 102 which is to be a sealing surface; and a second principal face 103 which is to be a mounting surface on a module substrate 400, and an insulating substrate 101 is provided with a mounting section 105. An electronic component 112 such as a piezoelectric oscillation device is mounted in the mounting section 105. The insulating substrate 101 has an upper insulating layer 106 and a lower insulating layer 107 which are laminated on top of each other.

A frame-shaped metallized layer 113 is formed on the first principal face 102 of the upper insulating layer 106, and a through conductor 117 is further provided in the upper insulating layer 106 so as to extend from an upper surface to a lower surface thereof. At a position immediately below the through conductor 117, the through conductor 117 is also provided in the lower insulating layer 107. Here, the through conductor 117 of the upper insulating layer 106 and the through conductor 117 of the lower insulating layer 107 are desirably formed at the same position in a plan view. However, in consideration of electric connectivity affected by dislocation of the laminated layers or the like, a relay conductor (not illustrated) may be provided between the upper insulating layer 106 and the lower insulating layer 107. Then, electrical conduction occurs from the frame-shaped metallized layer 113 to the through conductor 117 of the lower insulating layer 107 through the through conductor 117 of the upper insulating layer 106 and the relay conductor. Furthermore, the through conductor 117 of the lower insulating layer 107 is connected to an external connection conductor 108 which is formed on the second principal face 103. In this way, such a structure that the electrical conduction occurs from the frame-shaped metallized layer 113 to the external connection conductor 108 through the through conductors 117 and the relay conductor is provided.

As shown in FIGS. 1A and 1B, in the example of this wiring substrate, the frame-shaped metallized layer 113 provided on the first principal face 102 of the upper insulating layer 106; and a pair of connection pads 114 which is located in the mounting section 105 and to which the electronic component 112 is connected, is further provided. In this electronic component housing package 100, a lid body 116 is joined to the frame-shaped metallized layer 113 of the insulating substrate 101 by a brazing material 118 such as silver solder, and the electronic component 112 is thereby hermetically sealed.

Note that, in this embodiment, the insulating substrate 101 has the mounting section 105 in a concave section which has a concave shape in a cross-sectional view in a thickness direction thereof. The electronic component 112 such as the piezoelectric oscillation device is hermetically sealed in this electronic component housing package 100, and an electronic apparatus 300 is thereby formed. The lid body 116 that seals the mounting section 105 is seen through in FIGS. 1A and 1B as a matter of convenience. Here, in this embodiment, the insulating substrate 101 is provided with the mounting section 105 in the concave section; however, in the electronic component housing package 100, a plate-shaped insulating substrate (not illustrated) may not be provided with the concave section, a mounting section in which an electronic component 105 is mounted is provided on an upper surface thereof, the mounting section may be covered with a cap-type metallic lid body (not illustrated) which is joined to an outer periphery of the insulating substrate by a joining material such as glass.

The insulating substrate 101 is formed so that the upper insulating layer 106 is laminated on the plate-shaped lower insulating layer 107. In addition, in the plan view, the upper insulating layer 106 surrounds the mounting section 105 on an upper surface of the lower insulating layer 107. The concave section which includes the mounting section 105 for mounting the electronic component 112 is provided by an inner surface of this upper insulating layer 106 and the lower insulating layer 107 which is exposed on an inner side of the mounting section 105.

Each of the upper insulating layer 106 and the lower insulating layer 107 is, for example, made of a ceramic material such as an aluminum oxide sintered body, an aluminum nitride sintered body, a mullite sintered body, or a glass-ceramic sintered body. For example, as an entire outer shape, the insulating substrate 101 has a rectangular shape, one side of which is approximately 1.6 to 10 mm in length in the plan view, has a plate shape with approximately 0.3 to 2 mm in thickness, and has the concave mounting section 105 on the upper surface thereof.

In the case where each of the upper insulating layer 106 and the lower insulating layer 107 is made of the aluminum oxide sintered body, the insulating substrate 101 can be produced by adding and mixing an appropriate organic binder, a solvent, a plasticizer, and the like to/with raw powder such as aluminum oxides, silicon oxides, magnesium oxides, and calcium oxides to make mixture slurry, forming this slurry in a sheet shape by a sheet forming technique such as a doctor blade method or a roll calender method to obtain a plurality of ceramic green sheets, then appropriately punching some of the ceramic green sheets to have frame shapes, vertically laminating the ceramic green sheets so that each of the frame-shaped ceramic green sheets is placed on an upper surface of the plate-shaped ceramic green sheet which is not formed in the frame shape, and sintering the laminated body at a high temperature.

The insulating substrate 101 is produced, for example, by producing a matrix substrate 200 in which wiring substrate regions, each of which is to be an individual piece of the insulating substrate 101, are arranged and thereafter dividing the matrix substrate into the individual pieces. The matrix substrate 200 has a plate-shaped insulating layer (not illustrated) having a plurality of regions, each of which is to be the lower insulating layer 107; and an insulating layer (not illustrated) having a plurality of regions, each of which is to be the upper insulating layer 106 (in which a plurality of openings are arranged).

In the upper insulating layer 106, the frame-shaped metallized layer 113 is provided on the upper surface (the first principal face 102). In addition, on the mounting section 105 side of the lower insulating layer 107, the connection pads 114, the through conductor 117, the relay conductor, and the external connection conductor 108 are provided as an electrically conducting path for electrically connecting the electronic component 112 mounted in the mounting section 105 and an external electrical circuit of the module substrate 400, and the external connection conductor 108 is provided on a lower surface (the second principal face 103) of the lower insulating layer 107. In this example, the through conductor 117 is provided at a corner of the insulating substrate 101 but may be provided at another position on an outer side of the insulating substrate 101 such as on a long side or a short side.

Here, in order to prevent oxidation corrosion and facilitate the connection with the electronic component 112, the connection with the module substrate 400 by solder or the like, and the like, a nickel plating layer and a gold plating layer are sequentially deposited on each of the wiring conductors such as the connection pads 114 that are exposed from the electronic component housing package 100. In order to deposit the plating layers on each of the wiring substrates as described above, for example, the through conductors 117 are provided near an outer periphery of each of the wiring substrate regions which are formed and arranged in the matrix substrate 200 and are each to be the electronic component housing package 100, and a connection conductor 109 that connects the through conductors 117 is provided so as to extend across the adjacent wiring substrate regions. Furthermore, the wiring substrate regions are configured to be integrally connected via these connection conductors 109, and the plating layers are deposited on each of the wiring conductors, from which the wiring substrate region is exposed, by an electroplating method of supplying electricity to all of the wiring conductors such as the external connection conductor 108 formed in the matrix substrate 200.

Here, in the cases where the electronic apparatus is a temperature compensated crystal oscillator (TCXO) and a plurality of electronic components (not illustrated) are mounted in the mounting section 105, in order to provide a stepped inner surface in which the plurality of electronic components are mounted, the upper insulating layer 106 may be composed of two or more insulating layers.

In order to correspond to the electronic component 112 in a rectangular plate shape, for example, the mounting section 105 has a rectangular shape in the plan view. In the example of FIGS. 1A and 1B, the paired connection pads 114 are respectively provided at the two adjacent corners of the rectangular mounting section 105. This connection pad 114 functions as a conductor layer for connecting electrodes (not illustrated) of the electronic component 112 such as the piezoelectric oscillation device mounted in the mounting section 105. When the electronic component 112 is the piezoelectric oscillation device, an outer shape thereof is usually rectangular in the plan view, and a pair of electrodes (not illustrated) for the connection is provided at corners of a principal face thereof. In order to easily and reliably connect such electrodes, the connection pads 114 are provided at the corners on one side of the mounting section 105.

Each of the electrodes of the electronic component 112 is connected to the connection pad 114 via a joining material 115 such as an electrically conductive adhesive. More specifically, the electronic component 112 is positioned in the mounting section 105 so that the paired electrodes provided at the corners on the one side of the principal face of the electronic component 112 respectively oppose the paired connection pads 114 provided on the mounting section 105 as shown in FIG. 1A, the joining material 115 which is adhered to each of the connection pads 114 in advance is heated and solidified, and the electrodes of the electronic component 112 are thereby connected to the connection pads 114.

Note that, in the example of this embodiment, since the description has been made on the example in which the piezoelectric oscillation device is used as the electronic component 112, the connection pads 114 are provided at the positions as described above. However, in the case where another electronic component (not illustrated) is mounted or a plurality of other electronic components are mounted, the connection pads 114 may be provided by changing the positions and shapes thereof in accordance with an arrangement of the electrodes of the electronic component(s). Examples of such other electronic components include a piezoelectric device such as a ceramic piezoelectric device or a surface acoustic wave device, a semiconductor device, a capacitance device, and a resistor device.

The electronic component housing package 100 according to the embodiment of the invention includes the insulating substrate 101 having the first principal face 102 and the second principal face 103 opposing the first principal face 102, and the insulating substrate 101 having the lower insulating layer 107 which includes the second principal face 103 and has the mounting section 105 for mounting the electronic component 112, and the frame-shaped upper insulating layer 106 which includes the first principal face 102 and is provided on the lower insulating layer 107 so as to surround the mounting section 105; the plurality of external connection conductors 108 provided on the second principal face 103; and the connection conductors 109 provided so as to extend from outer peripheral ends of the external connection conductors 108 to an outer peripheral end of the insulating substrate 101. The connection conductors 109 are curved convexly toward the first principal face 102 side over a range from the outer peripheral ends of the external connection conductors 108 to the outer peripheral end of the insulating substrate 101 in a vertical cross-sectional view, and are provided so that a distance from each of the connection conductors 109 to the second principal face 103 is gradually increased in the thickness direction of the insulating substrate 101. An insulating bodies 110 are provided so as to cover the connection conductors 109.

With such a structure, even when the electronic component housing package 100 is downsized, such a structure is obtained that the connection conductors 109 are covered with the insulating bodies 110 in greater thickness as approaching the outer periphery of the wiring substrate. Accordingly, even when a division groove is provided on the second principal face 103 side of the matrix substrate 200, for example, the connection conductor 109 is less likely to be cut by the division groove. In addition, even in the case where stress generated during a division process is applied to an end of the connection conductor 109 when the matrix substrate 200 is divided, the connection conductor 109 is less likely to be delaminated, and reduction of bonding strength between the connection conductor 109 and the insulating substrate 101 is thereby inhibited. Therefore, the electronic component housing package 100 can firmly be mounted on the module substrate 400.

Figure 2:
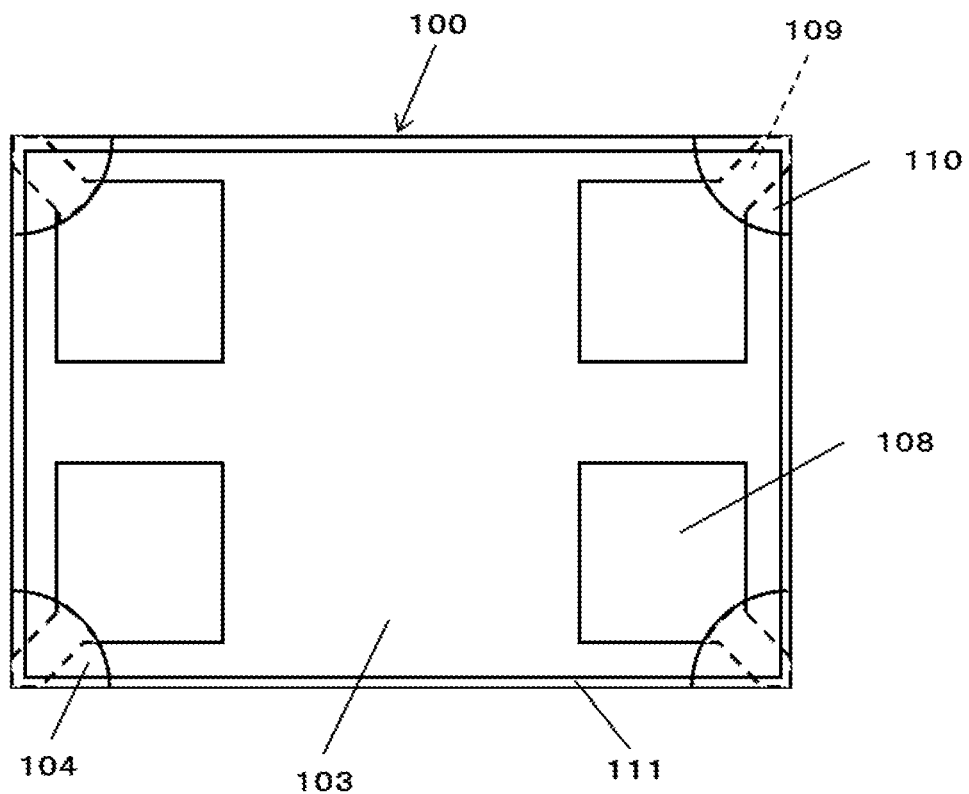
FIG. 2 is a transparent bottom view showing the electronic component housing package according to the embodiment of the invention.

In order to provide the connection conductor 109 to be curved convexly toward the first principal face 102 side over the range from the outer peripheral end of the external connection conductor 108 to the outer peripheral end of the insulating substrate 101 in the vertical cross-sectional view and so that the distance from the connection conductor 109 to the second principal face 103 is gradually increased in the thickness direction of the insulating substrate 101, for example, metallized pastes which are respectively to be the frame-shaped metallized layer 113, the connection pads 114, the external connection conductor 108, the connection conductor 109, and the like are preferably formed at specified positions of the single-layered ceramic green sheet which is to be the insulating substrate 101, and a ceramic paste which is to be the insulating body 110 is preferably formed at a specified position to cover an upper surface of the metallized paste which is to be the connection conductor 109. Here, as the ceramic paste, substantially the same material as that for the insulating substrate 101 is desirably used. The same material includes the same ceramic component as that in the insulating substrate 101 after being sintered, and additive amounts of the binder and the solvent to be mixed with ceramic are adjusted in accordance with a specification of an application method of this ceramic paste (for example, screen printing or the like). Then, an application shape of the ceramic paste is preferably formed in a fan shape (a circular shape on the matrix substrate), which has a shape of a quarter of a circle, as shown in FIG. 2, and thickness thereof may be the greatest at an outer edge of the insulating substrate 101. In this way, the connection conductor 109 can be provided so as to be easily curved convexly toward the first principal face 102 side over the range from the outer peripheral end of the external connection conductor 108 to the outer peripheral end of the insulating substrate 101 in the vertical cross-sectional view and so that the distance from the connection conductor 109 to the second principal face 103 is gradually increased in the thickness direction of the insulating substrate 101 in a pressurizing process, which will be described below. That is, a portion in which the large-sized insulating body 110 is provided forces the metallized paste for the connection conductor 109 into the ceramic green sheet for the insulating substrate 101 further deeply. Note that a forming position of the connection conductor 109 is provided at each of the corners of the insulating substrate 101, the outer periphery of which is not formed with a notch in FIG. 2, but may be provided at another position which is in contact with the outer peripheral end of the insulating substrate 101 such as a central side of the long side or the short side or may be provided at a position where the notch is not provided in the insulating substrate 101 formed with the notches on the outer periphery.

Furthermore, the mounting section 105 can be formed by pressurizing the surface of the ceramic green sheet by a pressurizing jig profiled with a convexity and a concavity (not illustrated), so as to provide the concave mounting section 105, the ceramic green sheet becoming the insulating substrate 101 and being provided with the metallized paste and the ceramic paste thereon. At this time, the pressurizing jig is positioned to pressurize a portion of the ceramic green sheet which corresponds to a bottom of the mounting section 105. In this way, a portion of the ceramic green sheet which is pressed by the convexity of the pressurizing jig becomes the mounting section 105, and a portion thereof which is pressed by the concavity of the jig is provided with a frame (the upper insulating layer 106) which surrounds the mounting section 105.

Thereafter, the ceramic paste, which is to be the insulating body 110, is pressed by the jig and the metallized paste, which is to be the connection conductor 109, is curved convexly toward the first principal face 102 side. Furthermore, as a result of pressing of the ceramic paste which is to be the insulating body 110, by the jig, it is possible to form a third principal face 104 which serves as one and the same plane as the second principal face 103 of the insulating substrate 101. Note that, in the case where the binder, whose glass-transition temperature is equal to or lower than a pressurization temperature by a mold, is added to the ceramic green sheet, the metallized paste, and the ceramic paste to be used, the frame, the third principal face 104, and the like can favorably be formed when the ceramic green sheet and the like are pressurized by the pressurizing jig.

At this time, the concavity of the pressurizing jig has constant width and depth, and thus the frame after pressurization processing can have constant width and height. Thus, dimensional accuracy can be improved by setting the width of the frame after the pressurization processing to be constant. The matrix substrate (not illustrated) in which the plurality of wiring substrate regions, each of which is to be the electronic component housing package 100, are arranged can be produced from a ceramic green sheet formed body in which the lower insulating layer 107, which is provided with the external connection conductor 108, the connection conductor 109, the connection pads 114, the through conductor 117, and the like, and the upper insulating layer 106, which is provided with the frame-shaped metallized layer 113, the through conductor 117, and the like, are integrated.

The nickel plating layer in thickness of approximately 1 to 20 μm and the gold plating layer in thickness of approximately 0.1 to 3.0 μm may sequentially be deposited on the exposed surfaces of the connection conductor 109, the frame-shaped metallized layer 113, the connection pads 114, the external connection conductor 108, and the like in order to prevent the oxidation corrosion and to facilitate or strengthen the connection between the connection pads 114 and the electrodes of the electronic component 112, the connection between the external connection conductor 108 and the module substrate 400, or the like.

In the case where the plating layers are deposited on the exposed surface of each of the wiring conductors, the plurality of external connection conductors 108, which are formed on the third principal face 104 of the electronic component housing package 100, and the module substrate 400 are connected by the electrically conductive joining material such as solder, and the electronic apparatus 300 is electrically and mechanically connected to the module substrate 400. In addition, as shown in FIG. 2, the connection conductor 109 is formed so as to extend from a portion with a large area of each of the external connection conductors 108 to the outer peripheral corner of the insulating substrate 101. Then, the external connection conductors 108 are formed to be separated from the outer periphery of the insulating substrate 101 in order to inhibit the delamination of the conductor layer at the time when the plurality of wiring substrate regions arranged in the matrix substrate 200, which will be described below, are divided into the individual pieces. Furthermore, since the connection conductor 109 is formed to extend to the outer periphery of the insulating substrate 101, in regard to this connection conductor 109, the delamination of the conductor layer at the time when the plurality of wiring substrate regions arranged in the matrix substrate 200 are divided into the individual pieces is concerned.

However, since the insulating body 110 is provided so as to cover the connection conductor 109, the delamination of the conductor layer during the division process of the matrix substrate 200 is inhibited. Furthermore, when the electronic component housing package 100 is connected to the module substrate 400 by solder or the like, the connection conductor 109 with a small area is not joined with the solder, that is, has the small area and the narrow width. Thus, such a structure can be obtained that mechanical stress generated during the connection to the module substrate 400 does not act on the connection conductor 109 in which a bonding force of a metal layer tends to be insufficient. Accordingly, even when the mechanical stress acts between the electronic apparatus 300 including the electronic component housing package 100 and the module substrate 400 due to thermal expansion and contraction occurred by a change in a temperature environment, the external connection conductors 108, which are provided in the large area, can receive the stress, and the connection conductor 109 can be formed in the insulating substrate 101. Therefore, it is possible to realize the electronic component housing package 100 which inhibits the delamination of the conductor layer and has superior mounting reliability.

In addition, in the electronic component housing package 100 according to the embodiment of the invention, the insulating body 110 has the third principal face 104 which serves as one and the same plane as the second principal face 103, and an inclined section 111 is provided from the third principal face 104 to the connection conductor 109 on an outer peripheral side surface of the insulating body 110 on the second principal face 103 side. With such a structure, the electrically conductive joining material such as solder is less likely to spread to the outer peripheral side of the insulating substrate 101.

More specifically, the connection conductor 109 is formed so as to extend from the external connection conductor 108, which is formed on the second principal face 103 of the insulating substrate 101, to the outer periphery of the insulating substrate 101, and the insulating body 110 is provided so as to cover the connection conductor 109. Accordingly, when the electronic component housing package 100 is connected to the module substrate 400 by solder or the like, the solder is not joined to the connection conductor 109 with the small area. Furthermore, as shown in FIG. 2, the inclined section 111 is provided from the third principal face 104 to the connection conductor 109 on the outer peripheral side surface of the insulating body 110 on the second principal face 103 side. Accordingly, even when external stress is applied to the insulating body 110 which is thinner than the upper insulating layer 106 and the lower insulating layer 107 during handling or the like, the stress that is applied in a direction to delaminate the insulating body 110 is more likely to be inhibited, and thus the insulating body 110 can be less likely to be delaminated.

Figure 3:
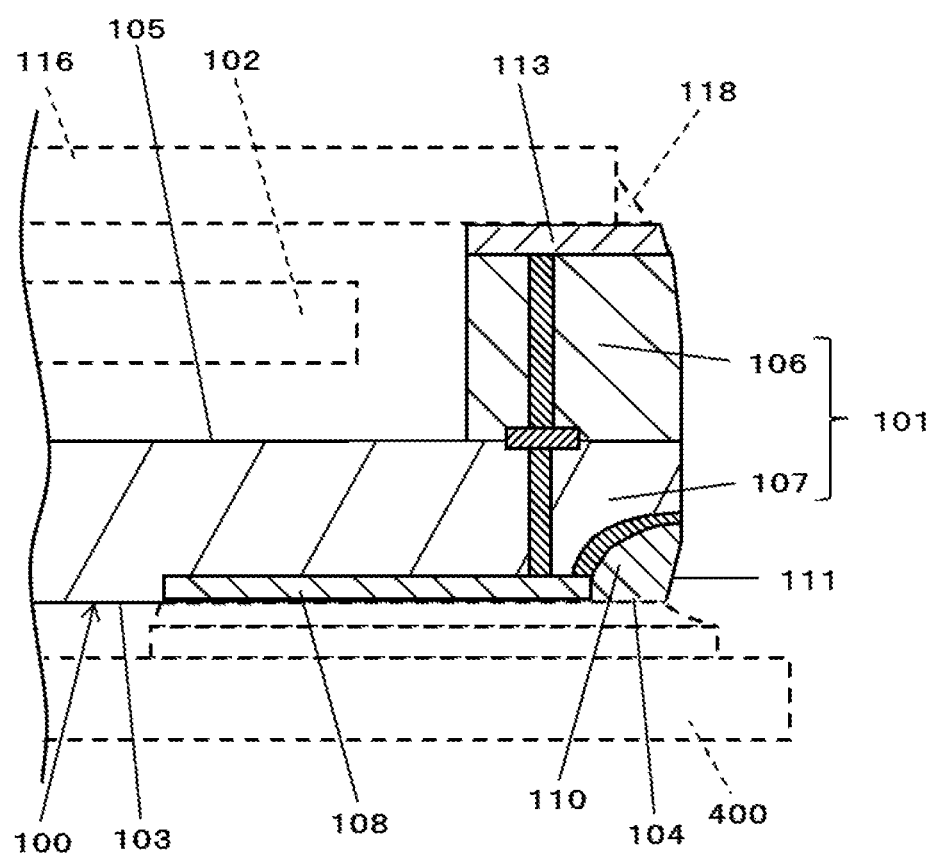
FIG. 3 is a cross-sectional view showing a main part of the electronic component housing package according to the embodiment of the invention.

In order to provide the inclined section 111 from the third principal face 104 to the connection conductor 109 on the outer peripheral side surface of the insulating body 110 on the second principal face 103 side as described above, for example, a division groove may be formed by a mold, a cutter blade, or the like on a boundary between the wiring substrate regions which are arranged in the matrix substrate 200 for manufacturing the electronic component housing package 100, and a formation angle of this groove may be provided as the inclined section 111. At this time, the connection conductor 109 provided on the boundary between the wiring substrate regions acts as an electrically conducting path that electrically connects between two each of the wiring substrate regions. Thus, in a forming process of this division groove, it is required to prevent the connection conductor 109 from being cut. Meanwhile, as shown in FIG. 3, the connection conductor 109 is provided so as to be curved convexly toward the first principal face 102 side over the range from the outer peripheral end of the external connection conductor 108 to the outer peripheral end of the insulating substrate 101 in the vertical cross-sectional view and so that the distance from the connection conductor 109 to the second principal face 103 in the thickness direction of the insulating substrate 101 is gradually increased. Accordingly, the maximum distance can be obtained between the connection conductor 109 and the third principal face 104 on the boundary between the wiring substrate regions, and cutting of the connection conductor 109 in the forming process of the division groove can be inhibited.

In addition, as shown in FIG. 3, the connection conductor 109, which is exposed to the outer peripheral side surface of the insulating substrate 101, is separated from the third principal face 104 via the insulating body 110 in the vertical cross-sectional view. Accordingly, the electrically conductive joining material such as the solder is less likely to spread upward on a lateral surface of the insulating substrate 101 and is inhibited from reaching the connection conductor 109. Note that the forming method of the division groove is not limited to the mold, the cutter blade, or the like, and the division groove may be formed by laser processing, for example. When a condition during the laser processing is optimized, the division groove with superior dimensional accuracy of width and depth can be formed.

In addition, since the inclined section 111 is separated from the connection conductor 109 on the outer peripheral side surface of the insulating substrate 101, a path in which the electrically conductive joining material such as solder spreads upward on the lateral surface of the insulating substrate 101 can be expanded, and thus the electrically conductive joining material can efficiently be inhibited from reaching the connection conductor 109.

With respect to a multi-piece wiring substrate according to the embodiment of the invention, the plurality of wiring substrate regions which are to be the above electronic component housing packages 100 are arranged in the matrix substrate 200. With such a structure, even when the electronic component housing package 100 is downsized and thinned, the favorable division groove can be formed on the side of the surface of the matrix substrate which is provided with the external connection conductor 108 (the second principal face side) while disconnection of the connection conductor 109 is inhibited. In addition, when the matrix substrate is divided into the individual pieces of the wiring substrates (becoming the electronic component housing packages 100), generation of a burr or a crack is inhibited, and thus the electronic component housing packages 100 with the superior dimensional accuracy can efficiently be produced.

That is, since the connection conductor 109 is provided so that a cross section thereof from the outer peripheral end of the external connection conductor 108 to the outer peripheral end of the insulating substrate 101 is curved convexly toward the first principal face 102 side and that the distance between the connection conductor 109 and the third principal face 104 is gradually increased, the delamination of the conductor and the generation of the burr or the crack can be inhibited at the time when the matrix substrate 200 is divided into the individual pieces of the wiring substrates. In other words, an end of the connection conductor 109 is less likely to be delaminated due to the stress generated during the division process. Accordingly, reduction of bonding strength between the connection conductor 109 and the insulating substrate 101 and the generation of the burr or the crack in each of the insulating substrates 101 after the division process are inhibited, and thus the electronic component housing packages with specified external dimensions can be produced.

Figure 4A:
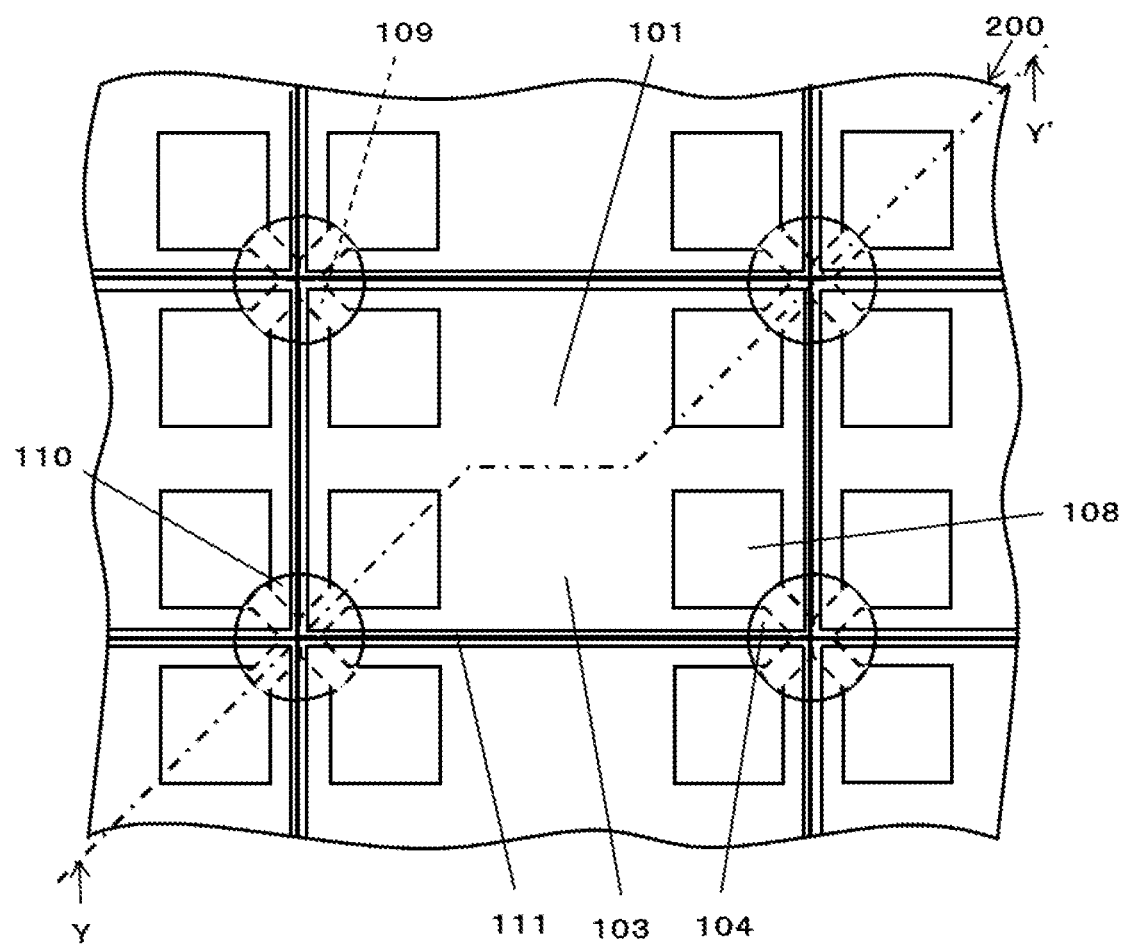
FIG. 4A is a transparent bottom view showing a multi-piece wiring substrate according to an embodiment of the invention.
Figure 4B:
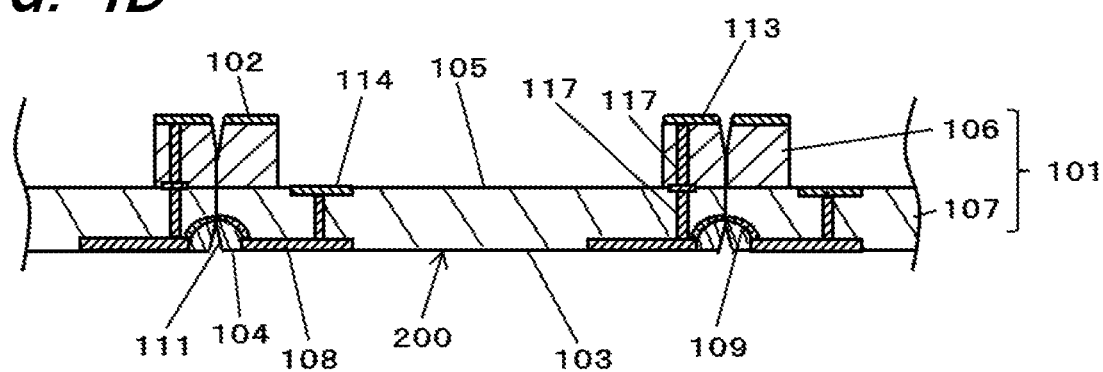
FIG. 4B is a cross-sectional view taken along the line Y-Y' in FIG. 4A.

The matrix substrate 200 is produced with a structure as shown in FIGS. 4A and 4B, for example. The external connection conductor 108 is provided at the four corners of each of the wiring substrates, and the connection conductor 109 is further provided so as to extend from the outer peripheral end of the external connection conductor 108 to the outer peripheral end corner of the wiring substrate. Moreover, the insulating body 110 is provided so as to cover the connection conductor 109, and the connection conductor 109 is provided so as to be curved convexly toward the first principal face 102 side in the vertical cross-sectional view and so that the distance from the connection conductor 109 to the second principal face 103 is gradually increased in the thickness direction of the insulating substrate 101. With such a structure, the connection conductor 109, which is exposed to the outer peripheral side surface of the insulating substrate 101, is formed on a central side in the thickness direction of the insulating substrate 101, and thus each of the connection conductors 109 can reliably be cut after the division process. In other words, since the connection conductor 109 can favorably be cut at the time when the matrix substrate 200 is divided into the individual pieces, the delamination of the conductor and the generation of the burr or the crack can be inhibited at the time when the matrix substrate 200 is divided into the individual pieces. Furthermore, the maximum distance can be obtained between the connection conductor 109 and the second principal face 103 (actually, the third principal face 104 of the insulating body 110 which is on one and the same plane as the second principal face 103) on the boundary between the wiring substrate regions.

Accordingly, such effects that the wiring substrate regions can favorably be connected via the connection conductor 109 and that cutting of the connection conductor 109 in the forming process of the division groove can be inhibited are exerted.

In order to form the division groove in the matrix substrate 200, the forming method thereof by the mold, the cutter blade, or the like and the forming method thereof by the laser processing are exemplified, for example. When the division groove is formed by the laser processing, for example, the following may be performed. More specifically, when the electronic component housing packages 100 are produced in a form of the multi-piece wiring substrate as described above, on an upper surface of the matrix substrate 200, in which the plurality of wiring substrate regions are longitudinally and horizontally arranged, the division grooves may be formed by the laser along the boundary between the wiring substrate regions. In conjunction with downward irradiation of the laser, the division groove with an inner surface which is inclined downward from an upper end side of the frame-shaped metallized layer 113 and the insulating substrate 101 is formed. Furthermore, in conjunction with upward irradiation of the laser, the division groove with the inner surface which serves as the inclined section 111 inclined upward from a lower end side (the second principal face 103, the third principal face 104) of the insulating substrate 101 is formed.

In this case, a process of forming the division groove by the laser preferably corresponds to a stage of the laminated body of the plurality of ceramic sheets, that is, the unsintered laminated body which is to be the matrix substrate 200. By forming the division groove by the later before sintering of the laminated body, favorable workability can be obtained, and adhesion of a molten material by the laser processing can be inhibited. More specifically, as a type of the laser, UV laser, green laser, IR laser, or the like may be used. In this way, output of the laser per unit area (unit area of a surface in a portion of an object to be processed, the portion being irradiated by the laser) is relatively small during the laser processing, and thus a generation amount of the molten material is small. In this case, compared to the frame-shaped metallized layer 113 (the sintered metal) which is formed in the matrix substrate after sintering, the frame-shaped metallized layer 113 which contains an organic material such as the binder before sintering can easily be eliminated by the laser processing. Accordingly, the inclined section 111 in a favorable shape can be formed even by the laser with relatively low energy as described above. Note that the division groove may be formed on both surfaces at the position where the division groove overlaps the division groove on the upper surface. In this way, a divisible property of the matrix substrate is further improved.

The electronic apparatus 300 according to the embodiment of the invention includes the electronic component housing package 100 described above and the electronic component 112 mounted in the electronic component housing package 100. With such a structure, it is possible to realize the electronic apparatus 300 with high connection reliability which inhibits reduction of the bonding strength and mounting failure in a mounting process of the electronic component housing package 100 in which the electronic component 112 is mounted, on the module substrate 400.

That is, since the insulating body 110 is provided in the insulating substrate 101 so as to cover the connection conductor 109, a structure of inhibiting the delamination of the connection conductor 109 is obtained. Furthermore, such a structure can be obtained that, when the electronic component housing package 100 is connected to the module substrate 400 by solder or the like, the connection conductor 109 with the small area is not joined with the solder, that is, the mechanical stress generated during the connection to the module substrate 400 does not act on the connection conductor 109 which has the small area and the narrow width and in which the bonding force of the metal layer tends to be insufficient. Accordingly, even when the mechanical stress acts between the electronic apparatus 300 and the module substrate 400 due to the thermal expansion and contraction occurred by the change in the temperature environment, the stress can be dispersed by the external connection conductors 108 which are provided in the large area, and the connection conductor 109 can be formed in the insulating substrate 101. Therefore, it is possible to realize the electronic component housing package 100 which inhibits the delamination of the connection conductor 109 and has the superior mounting reliability.

In addition, the inclined section 111 is provided from the third principal face 104 to the connection conductor 109 on the outer peripheral side surface of the insulating body 110 on the second principal face 103 side of the insulating substrate 101 included in the electronic apparatus 300. In this way, the electrically conductive joining material such as the solder is less likely to spread to the outer peripheral side of the insulating substrate 101. More specifically, the connection conductor 109 is formed so as to extend from the external connection conductor 108 which is formed on the second principal face 103 of the insulating substrate 101, to the outer periphery of the insulating substrate 101, and the insulating body 110 is provided so as to cover the connection conductor 109. Accordingly, when the electronic apparatus 300 is connected to the module substrate 400 by solder or the like, the solder is not joined to the connection conductor 109. Furthermore, as shown in FIG. 2, the inclined section 111 is provided from the third principal face 104 to the connection conductor 109 on the outer peripheral side surface of the insulating body 110 on the second principal face 103 side.

Conventionally, a solder fillet is formed by solder wetting from the connection conductor 109 to a lateral conductor which is formed on the outer surface of the insulating substrate 101. Accordingly, this solder fillet prevents a reduction in a mounting interval of the electronic apparatuses, and mounting density thereof cannot be increased. However, due to the structure as described above, the solder fillet is not formed in the conductor layer such as the lateral conductor formed on the outer surface of the insulating substrate 101. Thus, it is possible to increase the mounting density of the electronic apparatus 300 on the module substrate 400 in the plan view. In addition, a total area of the lower surface of the insulating substrate 101 which includes the second principal face 103 and the third principal face 104, becomes smaller than an area of the insulating substrate 101 in a top view. That is, since the area of the lower surface of the insulating substrate 101 can be reduced by the inclined sections 111, each of which is provided from the third principal face 104 to the connection conductor 109, it is possible to increase the mounting density of the electronic apparatus 300 on the module substrate 400 in the plan view. Furthermore, by forming a solder pad on an inner side from the outer edge of the electronic apparatus 300 (the insulating substrate 101) in a transparent plan view, at the time when the electronic apparatus 300 is mounted on the module substrate 400, the mounting density can further be increased.

An electronic module 500 according to the embodiment of the invention has the electronic apparatus 300 described above and the module substrate 400 to which the electronic apparatus 300 is connected. By using the above electronic apparatus 300, it is possible to realize the electronic module 500 whose connection reliability with the electronic component 112 mounted in the mounting section 105 is increased and which has superior operation reliability. That is, the solder is not joined to the connection conductor 109 by the electronic component housing package 100 in which the connection conductor 109 is provided so as to be curved convexly toward the first principal face 102 side over the range from the outer peripheral end of the external connection conductor 108 to the outer peripheral end of the insulating substrate 101 in the vertical cross-sectional view and so that the distance from the connection conductor 109 to the second principal face 103 in the thickness direction of the insulating substrate 101 is gradually increased. Accordingly, such a structure can be obtained that the mechanical stress generated during the connection to the module substrate 400 does not act thereon.

In addition, it is possible to realize the electronic apparatus 300 with the high connection reliability which inhibits the delamination of the metal layer such has the connection conductor 109 and reduction of the bonding strength thereof in the mounting process of the electronic apparatus 300 in which the electronic component 112 is mounted in this electronic component housing package 100, on the module substrate 400.

Furthermore, even in the case where the electronic component housing package 100 is downsized and thinned, the electronic apparatus 300 which is downsized and has the superior external dimension accuracy can be mounted therein by using the electronic component housing packages 100 with which the generation of the burr or the crack is inhibited, at the time when the matrix substrate for producing the component housing packages 100 is divided into the individual pieces of the wiring substrates (becoming the electronic component housing packages 100). Therefore, it is possible to realize the electronic apparatus 300 with the high connection reliability with which the mounting failure of the electronic apparatus 300 on the module substrate 400 is inhibited.

Note that the present disclosure is not limited to one example of the above-described embodiment, and various modifications are possible without departing from the scope of the invention. For example, the electronic component housing package 100 includes one mounting section 105 in the concave section formed concavely on the first principal face 102 side, but may have a plurality of mounting sections 105 therein. In addition, an electronic component housing package which has the mounting section 105 in the concave section formed concavely on the first principal face 102 side, and also has another mounting section (not illustrated) in a concave section formed concavely on the second principal face 103 side, that is, an electronic component housing package which has a so-called H-shaped structure in the vertical cross-sectional view may be produced. Furthermore, the forming position of the connection conductor 109 is provided at each of the corners of the insulating substrate 101, and the outer periphery the insulating substrate 101 is not formed with the notch in this embodiment. However, the forming position thereof may be provided at another position which is in contact with the outer peripheral end of the insulating substrate 101 such as the central side of the long side or the short side or may be provided at the position where the notch is not provided in the insulating substrate 101 provided with the notches on the outer periphery.

The invention claimed is:

1. An electronic component housing package, comprising:
an insulating substrate having a first principal face and a second principal face opposing the first principal face, the insulating substrate having a lower insulating layer including the second principal face, the lower insulating layer having a mounting section for mounting an electronic component, and a frame-shaped upper insulating layer including the first principal face, the frame-shaped upper insulating layer being provided on the lower insulating layer so as to surround the mounting section;
a plurality of external connection conductors provided on the second principal face; and
connection conductors provided so as to extend from outer peripheral ends of the external connection conductors to outer peripheral ends of the insulating substrate, respectively,
the connection conductors being provided over a range from the outer peripheral ends of the external connection conductors to the outer peripheral ends of the insulating substrate so that a distance from each of the connection conductors to the second principal face is increased in a thickness direction of the insulating substrate,
insulating bodies being provided so as to cover the connection conductors, respectively,
parts of the connection conductors which are exposed to outer peripheral side surfaces of the insulating substrate, respectively, being separated from the second principal face via the respective insulating bodies in the thickness direction of the insulating substrate.

2. The electronic component housing package according to claim 1, wherein
the insulating bodies each have a third principal face which serves as one and a same plane as the second principal face, and
the parts of the connection conductors which are exposed to the outer peripheral side surfaces of the insulating substrate, respectively, are separated from the third principal face via the respective insulating bodies.

3. The electronic component housing package according to claim 1, wherein
the insulating bodies each have a third principal face which serves as one and a same plane as the second principal face, and
inclined sections are provided from the third principal faces to the connection conductors on the outer peripheral side surfaces of the insulating bodies on a second principal face side, respectively.

4. The electronic component housing package according to claim 3, wherein
the inclined sections are separated from the connection conductors on the outer peripheral side surfaces of the insulating substrate, respectively.

5. A multi-piece wiring substrate, comprising:
a matrix substrate having a plurality of wiring substrate regions provided therein, each of which is to be the electronic component housing package according to claim 1.

6. An electronic apparatus, comprising:
the electronic component housing package according to claim 1; and
an electronic component mounted in the electronic component housing package.

7. An electronic module, comprising:
the electronic apparatus according to claim 6; and
a module substrate to which the electronic apparatus is connected.

8. The electronic component housing package according to claim 2, wherein
the insulating bodies each have a third principal face which serves as one and a same plane as the second principal face, and
inclined sections are provided from the third principal faces to the connection conductors on the outer peripheral side surfaces of the insulating bodies on a second principal face side, respectively.

9. The electronic component housing package according to claim 8, wherein
the inclined sections are separated from the connection conductors on the outer peripheral side surfaces of the insulating substrate, respectively.

10. A multi-piece wiring substrate, comprising:
a matrix substrate having a plurality of wiring substrate regions provided therein, each of which is to be the electronic component housing package according to claim 2.

11. A multi-piece wiring substrate, comprising:
a matrix substrate having a plurality of wiring substrate regions provided therein, each of which is to be the electronic component housing package according to claim 3.

12. A multi-piece wiring substrate, comprising:
a matrix substrate having a plurality of wiring substrate regions provided therein, each of which is to be the electronic component housing package according to claim 4.

* * * * *